United States Patent [19]

Rai et al.

[11] Patent Number: 4,627,027

[45] Date of Patent: Dec. 2, 1986

[54] ANALOG STORING AND REPRODUCING APPARATUS UTILIZING NON-VOLATILE MEMORY ELEMENTS

[75] Inventors: Yasuki Rai, Ogaki; Yuji Kitamura, Gifu; Minoru Hamada, Ogaki, all of Japan

[73] Assignee: Sanyo Electric Co., Ltd., Osaka, Japan

[21] Appl. No.: 525,814

[22] Filed: Aug. 23, 1983

[30] Foreign Application Priority Data

Sep. 1, 1982 [JP] Japan ............................. 57-153235
Sep. 9, 1982 [JP] Japan ............................. 57-157885

[51] Int. Cl.⁴ ...................... G11C 27/00; G11C 7/00
[52] U.S. Cl. .................................... 365/45; 365/185; 365/189
[58] Field of Search ................. 365/45, 184, 185, 189; 357/23.5

[56] References Cited

U.S. PATENT DOCUMENTS

| | | | |
|---|---|---|---|
| 3,909,806 | 9/1975 | Uchida | 365/45 |
| 4,181,980 | 1/1980 | McCoy | 365/45 |
| 4,200,841 | 4/1980 | Nagata et al. | 365/185 |
| 4,280,199 | 7/1981 | Osakabe | 365/239 |
| 4,460,980 | 7/1984 | Hagiwara et al. | 365/184 |

FOREIGN PATENT DOCUMENTS

| | | | |
|---|---|---|---|
| 0031634 | 3/1977 | Japan | 357/23.5 |
| 0134977 | 10/1980 | Japan | 357/23.5 |
| 0087294 | 7/1981 | Japan | 365/45 |
| 0176598 | 10/1982 | Japan | 365/45 |

OTHER PUBLICATIONS

Electronics Review, "Japanese Develop Non-Destructive Analog Semiconductor Memory", Electronics, Jul. 11, 1974, pp. 29–30.

Morton, "Analog Memory Array", IBM Technical Disclosure Bulletin, vol. 21, No. 6, Nov. 1978, pp. 2349–2351.

Primary Examiner—James W. Moffitt
Assistant Examiner—Glenn A. Gossage
Attorney, Agent, or Firm—W. G. Fasse; D. H. Kane, Jr.

[57] ABSTRACT

An analog value storing apparatus comprises a semiconductor field-effect device, including a substrate, a source and drain formed to define a channel region, a floating gate embedded in an insulating layer on the channel region, a control gate connected to the ground on the insulating layer above the floating gate, a write voltage source coupled to the source to supply a write voltage to charge the floating gate, a resistor having a relatively high resistance value inserted between the write voltage source and the source, and an analog value voltage source connected to the drain. As a result, the floating gate begins to be charged with the write voltage and the analog voltage and stops being charged with the voltage at the source determined as voltage division of the write voltage and the analog voltage by the high resistance value of the resistor and the internal resistance value of the device. Preferably, an array of a plurality of such devices is used and an analog signal is stored in the form of a series of sampled analog values sampled from the analog signal at the timing of addressing while such devices are addressed sequentially. The stored analog values are read out while the devices are addressed, whereby and original analog signal is reproduced.

7 Claims, 19 Drawing Figures ed. 4,627,027

ANALOG STORING AND REPRODUCING APPARATUS UTILIZING NON-VOLATILE MEMORY ELEMENTS

BACKGROUND OF THE INVENTION

1. Field of the Invention

The present invention relates to an analog information storing and reproducing apparatus. More specifically, the present invention relates to an improved non-volatile field-effect memory capable of storing and reproducing analog information such as analog values or an analog signals.

2. Description of the Prior Art

Conventionally, non-volatile field-effect memories have been put into practical use for the purpose of storing and reproducing digital information in the form of logic values one and zero. To store and reproduce analog information, such as analog values or analog signals, with such non-volatile field-effect memories, it was necessary to convert such analog information into digital information with a plurality of bits by the use of an analog/digital converter, and then to store this plurality of bits of digital information in and reproduce it from a plurality of non-volatile field-effect memories. Thus, an analog/digital converter was indispensable in storing analog information in non-volatile memory devices of the field-effect type after analog/digital conversion and an increased number of such non-volatile field-effect memory devices was required in order to increase accuracy of stored and reproduced analog information. Furthermore, a digital/analog converter was also required to restore analog information from the digital information stored in such non-volatile field-effect memory devices.

The present inventors first thought of an approach to store an analog value directly in and reproduce it from one non-volatile field-effect memory without analog/digital and digital/analog conversion, by noting the fact that in a non-volatile field-effect memory device which stores information by electrically changing its threshold voltage a variable amount of the threshold voltage is changeable as a function of a write voltage.

To describe in more detail this approach thought of by the present inventors, it would be appropriate to first describe in more detail one example of such non-volatile field-effect memory devices.

FIG. 1 is a diagrammatic sectional view of a non-volatile field-effect memory device. The memory device shown in FIG. 1 is often referred to as a stacked gate avalanche MOS device and comprises a semiconductor substrate 10 of one conductivity type, such as a silicon substrate of an N-type, source and drain regions 11 and 12 of the opposite conductivity type, such as a P-type, formed on the substrate 10 and spaced apart from each other, thereby defining a channel region 14 therebetween, a silicon oxide film 15 of a thickness of about 200 Å formed on the channel region 14, a floating gate 13 made of polycrystalline silicon highly doped with an impurity or metal such as molybdenum formed on the silicon oxide film 15 above the channel region 14, a silicon nitride film 16 of a thickness of about 1000 Å formed to cover the floating gate 13, a control gate 17 formed on the silicon nitride film 16 above the floating gate 13, and source and drain electrodes 18 and 19 formed on and in ohmic contact with the source and the drain regions 11 and 12, respectively.

Such memory devices M have the floating gate 13 completely insulated by the silicon oxide film 15 and the silicon nitride film 16 and hence have a threshold voltage Vtm that varies as a function of the quantity of electric charge injected into the floating gate 13 by the use of some means, whereby information can be stored in the form of this charge. Such memory devices M were originally developed and have been used as a non-volatile memory in digital information applications, in view of the fact that storage of information in such a form is suited for digital information such as the logical values one and zero.

Meanwhile, the inventors of the present application thought of utilizing such memory devices M as analog information memories by noting the fact that the threshold voltage is variable as a function of the quantity of the electric charge injected into the floating gate 13 and hence the threshold voltage is dependent on the quantity of the injected electric charge. This thought by the inventors to use the above described memory device M as an analog information memory will now be considered in more detail.

FIG. 2 is a schematic diagram showing the use of the above described memory device M as an analog information memory and in particular, the use in a write mode thereof for directly storing an analog value in the memory device M without analog/digital conversion, which was first thought of by the present inventors. Referring to FIG. 2, a non-volatile field-effect memory device M having a floating gate FG is shown and, according to the original thought of the inventors, the control gate CG of the memory device M is connected to the ground, the source electrode S of the memory device M is kept open, and the drain electrode D of the memory device M is connected to receive a voltage of an analog value signal VS having a predetermined analog value at the time of writing superimposed on a critical voltage VW required for writing the information. As a result, a quantity of electric charge corresponding to the analog signal VS is injected into the floating gate FG of the memory device, whereby the analog value is stored in the form of the quantity of the electric charge.

However, it was observed that according to the method of writing analog information shown in FIG. 2, an electric charge with a magnitude proportional to the voltage (VW+VS) applied to the drain D is not necessarily stored in the floating gate FG. Because of diversification of the thickness and composition of the insulating films existing between the floating gate FG and the control gate CG, and between the floating gate FG and the substrate SB and, analog information cannot be stored with high accuracy. Hence, it is desired that analog information be directly stored in and reproduced from such non-volatile field-effect memory devices with high accuracy and without analog/digital and digital/analog conversion.

On the other hand, an analog signal such as an audio signal is most typically recorded on a magnetic tape and is reproduced therefrom by means of a magnetic tape recorder. Such tape recorders have been used for many years and have been much improved in many aspects. However, a fundamental structure of such magnetic tape recorders is a magnetic tape adapted to travel mechanically while an analog signal is electromagnetically recorded on the tape and then the analog signal recorded on the magnetic tape is read from the magnetic tape. Hence, such magnetic tape recorders inevitably involve the problem that a mechanical structure is required, resulting in lack of reliability and time dependent changes due to mechanical wear of the components. Another problem that is also involved in such magnetic tape recorders is that accessing a particular recorder portion in a magnetic tape requires much time, with the result that immediate access to any particular recorded portion of a magnetic tape is difficult. Such digital technologies referred to as PCM, PWM or the like have also been proposed as audio reproducing apparatus without inclusion of such mechanical structures. Furthermore, speech synthesis technology employing the PACOR approach, LSP and the like has also already been proposed and put into practical use. While employment of PCM, PWM or the like achieves the original intention of eliminating mechanical components, a huge amount of storage capacity is required for storing audio information and hence such an approach can be employed only in the case of large scale apparatus. On the other hand, a speech synthesis technology, such as the PACOR method, was proposed for the purpose of decreasing the storage capacity required for such PCM, PWM or the like, and was successful in terms of storage capacity. However, this method requires much work and time for extracting coefficients for speech synthesis from a speech to be reproduced and furthermore speech synthesis from such coefficients indispensably requires a processor such as a microcomputer, with the result that simplification of such apparatus is difficult and accordingly the use of the same for general purposes is disadvantageous. Nevertheless, as previously described, speech synthesis technology requires much time for extraction of the coefficients and is difficult to utilize by general users because of the incapability of recording and reproduction on a real time basis as compared to existing tape recorders. Accordingly, it is also desired that an improved analog information storing and reproducing apparatus is provided for accurately, simply, and directly storing and reproducing an analog signal that is variable as a function of time.

SUMMARY OF THE INVENTION

Briefly described, the present invention comprises an analog value storing apparatus, comprising: a semiconductor field-effect device, including a semiconductor substrate of one conductivity type, first and second regions of the opposite conductivity type formed on the semiconductor substrate spaced apart from eath other, thereby defining a channel region therebetween, an insulating layer formed on the channel region, an electric charge storing layer formed inside the insulating layer above the channel region, and a control gate formed on the insulating layer above the electric charge storing layer, the semiconductor field-effect device exhibiting a resistance value between the first and second regions across the channel region as a function of the quantity of electric charge stored in the electric charge storing layer, write voltage supply means coupled to one of the first and second regions for supplying a write voltage to the semiconductor field-effect device for enabling the electric charge storing layer to be charged as a function of the write voltage, resistor means inserted between the write voltage supply means and the said one of the first and second regions and having a relatively high resistance value, and analog value voltage supply means coupled to one of the control gates and the other of the first and second regions for supplying an analog value voltage to the semiconductor field-effect device.

In operation, the electric charge storing layer starts being charged as a function of the write voltage and the analog value voltage and the charging is stopped as a function of the voltage at one of the first and second regions determined as a voltage division of the write voltage and the analog value voltage by means of the relatively high resistance value of the resistor means and the resistance value of the semiconductor field-effect device. As a result, the quantity of electric charge stored in the electric charge storing layer is accurately determined as a function of the analog value voltage.

Preferably, the inventive analog value storing apparatus further comprises mode selecting means for selecting operation modes including an erase mode, a write mode and a read mode, erase voltage supply means responsive to selection of the erase mode for supplying an erase voltage to the control gate, connection means responsive to selection of the write mode for connecting the write voltage supply means and the analog value voltage supply means to the semiconductor field-effect device, and electric charge quantity determining means responsive to selection of the read mode for determining the quantity of electric charge stored in the electric charge storing layer. Preferably, the relatively high resistance value of the resistor means is selected to be high enough to sufficiently decrease the rate of charging per unit time of the electric charge storing layer due to a voltage drop of the write voltage determined by the ratio of the relatively high resistance value of the resistor means to the resistance value of the semiconductor field-effect device at the time when a channel is formed in the channel region of the semiconductor field-effect device.

In another embodiment of the analog value storing apparatus of the invention, a semiconductor field-effect device having no control gate may be employed. In such a case, erase radiation supply means responsive to the selection of the erase mode for supplying an erase radiation to the field-effect devices, is substituted for the erase voltage supply means.

Briefly described, the present invention also comprises an analog signal storing apparatus, comprising a memory array including an array of a plurality of semiconductor field-effect devices, wherein each device may be of the same structure as that of the semiconductor field-effect device employed in the previously described analog value storing apparatus, addressing means coupled to the memory array for sequentially addressing the plurality of semiconductor field-effect devices, write voltage supply means commonly coupled to the plurality of semiconductor field-effect devices and responsive to the addressing by the addressing means for supplying a write voltage to the semiconductor field-effect devices, as sequentially addressed, for enabling the electric charge storing layer of the semiconductor field-effect devices, as sequentially addressed, to be charged, resistor means commonly inserted between the write voltage supply means and the plurality of semiconductor field-effect devices and having a relatively high resistance value, and analog signal supply means commonly coupled to the plurality of semiconductor field-effect devices for commonly supplying an analog signal to the plurality of semiconductor field-effect devices.

In operation, the electric charge storing layer of each semiconductor field-effect device, as sequentially addressed, starts being charged as a function of the write voltage and the analog value voltage of the analog signal at the time of addressing and the charging is stopped as a function of the voltage at each semiconductor field-effect device, as sequentially addressed, determined as a voltage division of the write voltage and the analog value voltage of the analog signal at the time of addressing by the relatively high resistance value of the resistor means and the resistance value of each semiconductor field-effect device, as sequentially addressed. As a result, the quantity of electric charge stored in the electric charge storing layer of each semiconductor field-effect device, as sequentially addressed, is accurately determined as a function of the analog value voltage of the analog signal at the time of addressing. As a result, the analog value voltages of the analog signal at a plurality of time points of addressing are stored in the plurality of semiconductor field-effect devices.

A preferred embodiment of the inventive analog signal storing apparatus further comprises mode selecting means for selecting operation modes including an erase mode, a write mode and a read mode, erase voltage supply means responsive to selection of the erase mode for supplying an erase voltage to the control gate of each semiconductor field-effect device, connection means responsive to selection of the write mode for connecting the write voltage supply means and the analog voltage supply means to each semiconductor field-effect device, as sequentially addressed, and electric charge quantity determining means responsive to selection of the read mode for determining the quantity of electric charge stored in the electric charge storing layer of each semiconductor field-effect device, as sequentially addressed.

In a preferred embodiment of the inventive analog signal storing apparatus, the relatively high resistance value of the resistor means is selected to be, at least, high enough in the same manner as described in conjunction with the analog value storing apparatus. In a preferred embodiment of the inventive analog signal storing apparatus, the relatively high resistance value of the resistor means is also selected to be, at most, small enough to decrease the transfer delay of the write voltage caused as a function of the product of the resistance value and a parasitic capacitance value with respect to the sampling time of the analog signal determined by the addressing.

In another embodiment of the analog signal storing apparatus, each semiconductor field-effect device may be a device having no control gate, in which case an erase radiation supply means is activated in response to the selection of the erase mode for supplying an erase radiation to the electric charge storing layer. Thus, the erase radiation supply means replace the erase voltage supply means.

Accordingly, a principal object of the present invention is to provide an analog value storing apparatus, comprising a semiconductor field-effect device having an electric charge storing layer formed by an insulating layer above a channel region, wherein a quantity of electric charge can be stored in the electric charge storing layer so as to be determined with accuracy as a function of the analog value voltage supplied to the semiconductor field-effect device.

Another object of the present invention is to provide an analog signal storing apparatus, comprising a memory array including an array of a plurality of semiconductor field-effect devices each having an electric charge storing layer formed from an insulating layer above a channel region, wherein, while the plurality of the semiconductor field-effect devices are sequentially addressed, a quantity of electric charge is accurately determined as a function of the analog value voltage of the analog signal at the time of addressing and is stored in the electric charge storing layer of each semiconductor field-effect device, as sequentially addressed, whereby the analog value voltages of the analog signal at a plurality of adressing time points are stored in the plurality of semiconductor field-effect devices.

A further object of the present invention is to provide an analog value storing apparatus and an analog signal storing apparatus, wherein an analog value and an analog signal can be directly stored therein and accurately reproduced therefrom without analog/digital conversion and without digital/analog conversion.

These objects and other object features, aspects and advantages of the present invention will become more apparent from the following detailed description of the present invention when taken in conjunction with the accompanying drawings.

DESCRIPTION OF THE PREFERRED EMBODIMENTS

Figure 1:
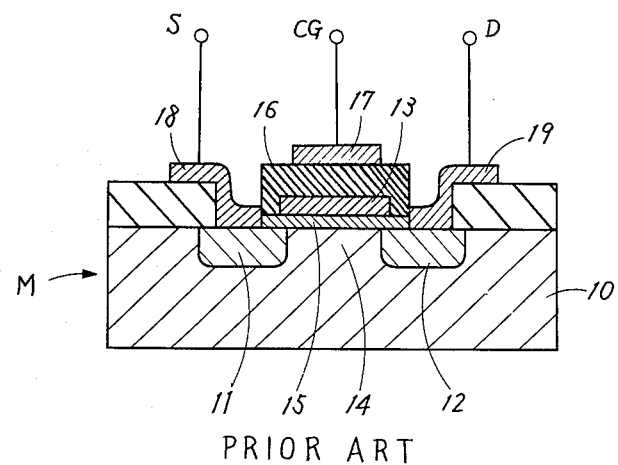
FIG. 1 is a diagrammatic sectional view of a non-volatile field-effect memory device.
Figure 2:
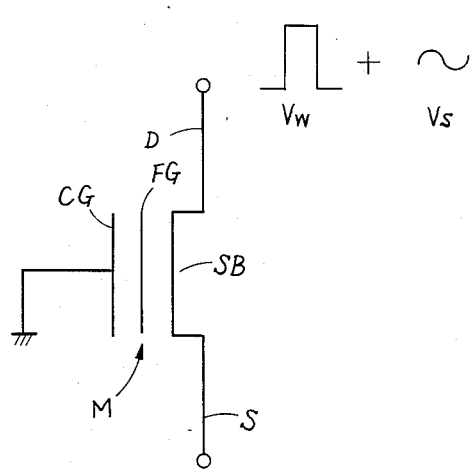
FIG. 2 is a schematic diagram showing the use of a memory device as an analog information memory, in particular, the use in a write mode for directly storing an analog value in the memory device.
Figure 3:
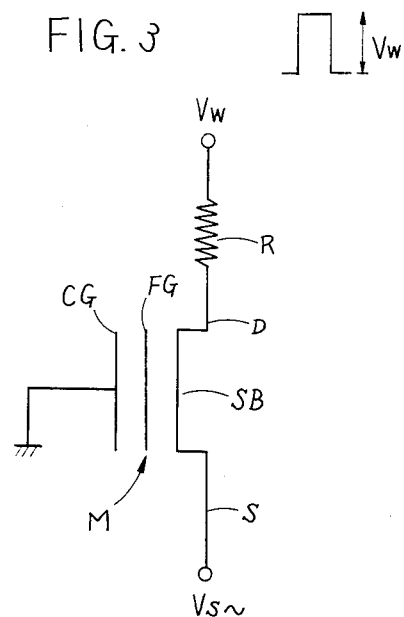
FIG. 3 is a schematic diagram of one embodiment of an analog value storing apparatus in accordance with the present invention.

FIG. 3 is a schematic diagram of one embodiment of an analog value storing apparatus in accordance with the present invention. The embodiment shown in FIG. 3 comprises a non-volatile field-effect memory device M having a control gate CG connected to ground, a drain D connected through a resistor having a relatively high resistance value to a write voltage source VW which supplies a write critical voltage VW, and a source S connected to an analog value voltage source VS. The non-volatile memory device M may comprise a memory device of a field-effect type as shown in FIG. 1.

As is well known, a non-volatile field-effect memory device having a floating gate FG exhibits an internal resistance value between the drain and source across the channel region corresponding to the quantity of electric charge stored in the floating gate FG, when the control gate voltage is fixed. According to the present invention, the floating gate FG starts being charged as a function of the write voltage VW and the analog value voltage VS and the charging is stopped as a function of the voltage at the drain determined as a voltage division of the write voltage VW and the analog value voltage VS by means of the relatively high resistance value of the resistor R and the internal resistance value of the memory device M. As a result, the quantity of electric charge stored in the floating gate is accurately determined as a function of the analog value voltage. The mechanism of accurately storing such an analog value voltage VS in the floating gate will be considered in more detail below.

Application of the write critical voltage VW to the drain D of the memory device M causes impact ionization at the drain D, whereby avalanche breakdown and tunnel phenomena occur, with the result that only electrons are injected into the floating gate FG through the insulating film between the floating gate FG and the drain D. As a result, the threshold voltage Vtm of the memory device M moves from the enhancement side toward the depletion side in terms of the characteristic curve of such field-effect device. When the threshold voltage Vtm becomes equal to a voltage proportional to the analog value voltage VS in the course of such a change of the threshold voltage, i.e. at the time when Vtm equals $-VS$, the memory device M is turned on. As a result, the potential VD of the drain D is decreased to a value determined by the ratio of the resistance value of the resistor R and the internal resistance R' of the memory device M, and the injection of the electric charge into the floating gate FG, i.e. the writing of the analog information into the memory device M, is stopped when the following equation is met:

$$VD = (VW - VS) \cdot R'/(R + R')$$

Preferably, the relatively high resistance value of the resistor R is selected to be at least high enough to sufficiently decrease the rate of charging per unit time, of the floating gate due to a voltage drop of the write voltage determined by the ratio of the relatively high resistance value of the resistor R to the internal resistance R' of the memory device M at the time when a channel is formed on the channel region of the memory device M.

Figure 4:
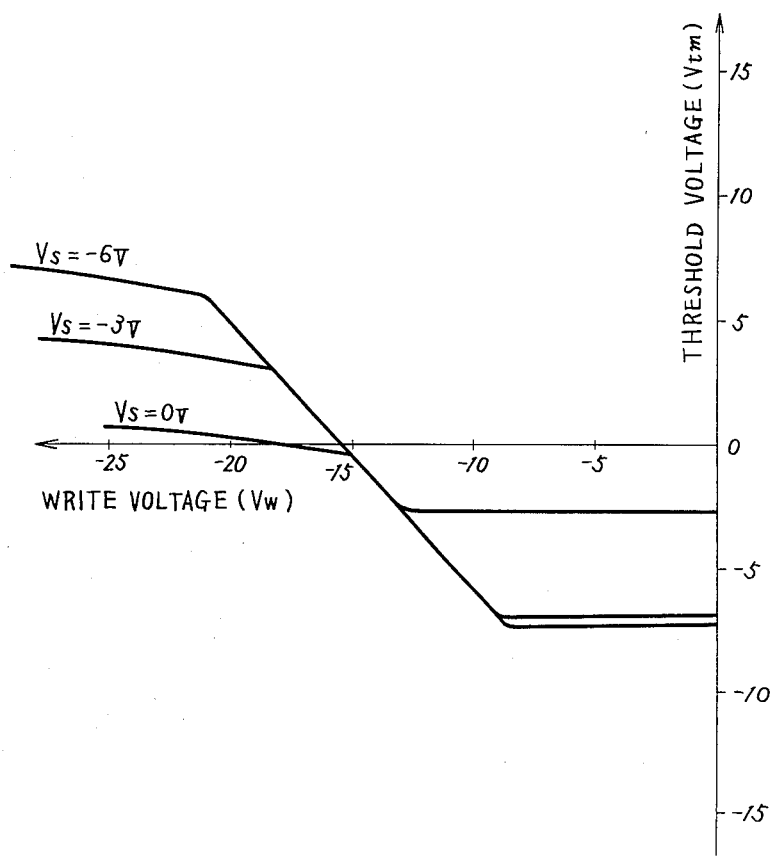
FIG. 4 is a graph showing the characteristic curve of the memory device shown in FIG. 3.

FIG. 4 is a graph showing the characteristic curve of the memory device M shown in FIG. 3, wherein the ordinate indicates the threshold voltage Vtm and the abscissa indicates the write voltage VW, with several analog value voltages as a parameter.

Figure 5:
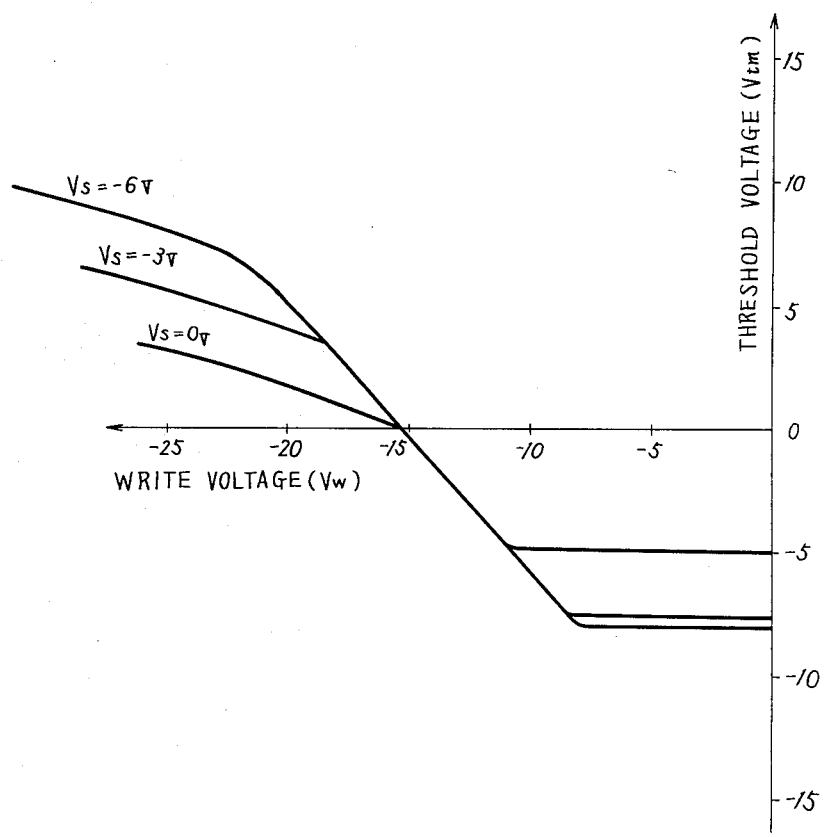
FIG. 5 is a graph similar to that shown in FIG. 4 but shows the characteristic curve of the memory device connected as shown in FIG. 3 but with a resistor of a relatively smaller value.

FIG. 5 is a graph similar to that shown in FIG. 4 but shows a characteristic curve of the memory device connected as shown in FIG. 3 but without the resistor R. From a comparison of the graphs shown in FIGS. 4 and 5, it should be appreciated that the insertion of the resistor R having a relatively high resistance value serves to stabilize the write operation of the memory device connected as an analog value storing apparatus in accordance with the present invention.

Figure 6:
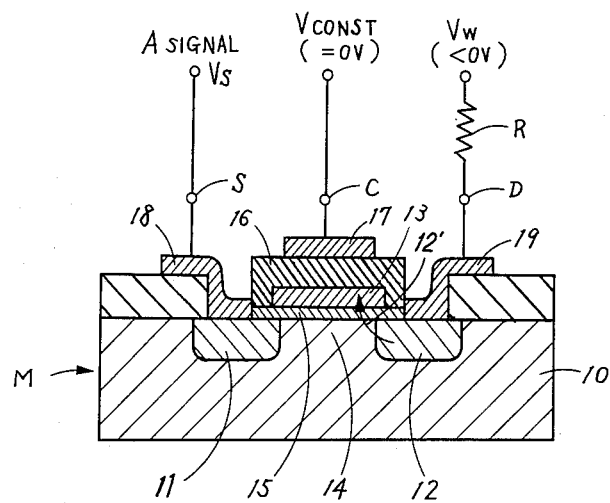
FIG. 6 is a view similar to that shown in FIG. 1 but diagrammatically shows a connection of the memory device to the voltage sources for the purpose of a write operation in accordance with the embodiment shown in FIG. 3.

FIG. 6 is a view similar to that shown in FIG. 1 but diagrammatically shows a connection of the memory device 1 to the voltage sources for the purpose of a write operation in accordance with the embodiment shown in FIG. 3. More specifically, the drain electrode D is shown connected through the resistor R to the write voltage source VW supplying a write voltage VW which is a negative voltage in this case, the control gate C is shown connected to a voltage source $V_{CONST}$ supplying a constant voltage $V_{CONST}$ which is 0 V in this case, and the source electrode S is shown connected to an analog value voltage source supplying an analog value voltage VS. Charging of the floating gate 13 by injection of electrons into the gate 13 from the drain region 12 through the insulating layer 15 is shown by an arrow 12'.

Figure 7:
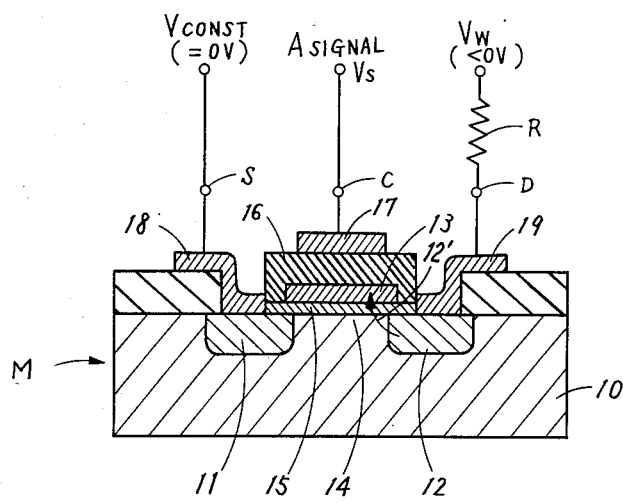
FIG. 7 is a view similar to that shown in FIG. 6 but shows another embodiment of a connection of the memory device for the purpose of writing analog information.

FIG. 7 is a view similar to that shown in FIG. 6 but shows another embodiment of a connection of the memory device M for the purpose of writing analog information. Referring to FIG. 7, the control gate 17 is shown connected to the analog value voltage source VS and the source electrode 18 is shown connected to the constant voltage source $V_{CONST}$, while the remaining portions are the same as those shown in FIG. 6. Substantially the same write operation as shown by an arrow 12' can be performed even in accordance with the embodiment shown in FIG. 7.

Figure 8:
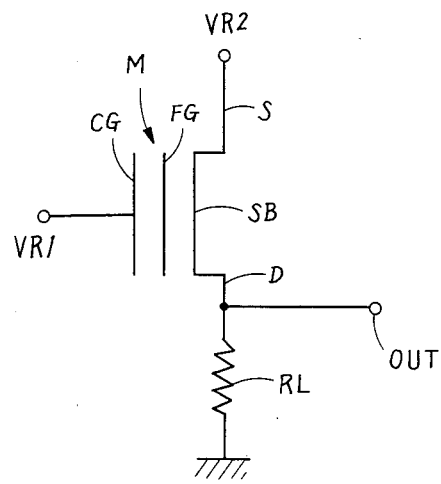
FIG. 8 is a schematic diagram of a connection of the memory device for the purpose of reading the analog information stored in the memory device.

FIG. 8 is a schematic diagram of a connection of the memory device M for the purpose of reading the analog information stored in the memory device M. For the purpose of reading the stored analog information, the drain D is connected through a load resistor RL to ground, the control gate CG is connected to a first read voltage source VR1 which supplies a first read voltage VR1, and the source S is connected to a second read voltage source VR2 which supplies a second read voltage VR2. The junction of the drain D and the load resistor RL is connected to an output terminal OUT.

In a read operation, the memory device M is turned on as a function of the first read voltage VR1 and the degree of conduction of the memory device M is determined as a function of the quantity of electric charge stored in the floating gate. As a result, the output voltage obtained from the output terminal as a voltage division of the second read voltage VR2 by the internal resistance value of the memory device M and the resistance value of the load resistor RL is proportional to the quantity of the electric charge stored in the floating gate and thus to the stored analog information.

Figure 9:
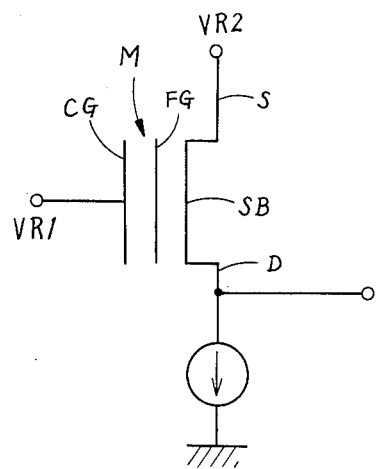
FIG. 9 is a diagram similar to that shown in FIG. 8 but diagrammatically shows a connection of the memory device in accordance with another embodiment for the purpose of reading the stored analog information.

FIG. 9 is a diagram similar to that shown in FIG. 8 but diagrammatically shows a connection of the memory device M in accordance with another embodiment for the purpose of reading stored analog information. Referring to FIG. 9, a constant current source CS has been substituted for the load resistor RL in the embodiment shown in FIG. 8, while the remaining portions are the same as shown in FIG. 8. Since the read operation by the embodiment shown in FIG. 9 is self-explanatory, it is not believed necessary to describe the same in more detail.

Figure 10:
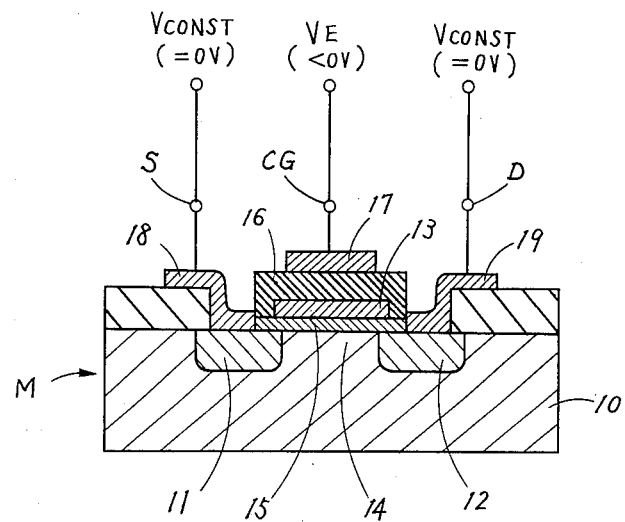
FIG. 10 is a view similar to that shown in FIGS. 6 and 7 but diagrammatically shows a connection of the memory device for the purpose of erase operation.

FIG. 10 is a view similar to those shown in FIGS. 6 and 7 but diagrammatically shows a connection of the memory device M for the purpose of an erase operation. More specifically, the drain electrode D is shown connected to a constant voltage source $V_{CONST}$ which supplies a constant voltage $V_{CONST}$ which is 0 V in this case, the control gate CG is shown connected to an erase voltage source VE which supplies an erase voltage VE which is a negative voltage in this case, and the source electrode S is shown connected to the constant voltage source $V_{CONST}$ which supplies a constant voltage $V_{CONST}$ which is 0 V in this case. As is well known, application of a negative voltage to the control gate while the drain and source regions are maintained at 0 V serves to expel the electric charge stored in the floating gate, thereby erasing the stored analog information.

Figure 11:
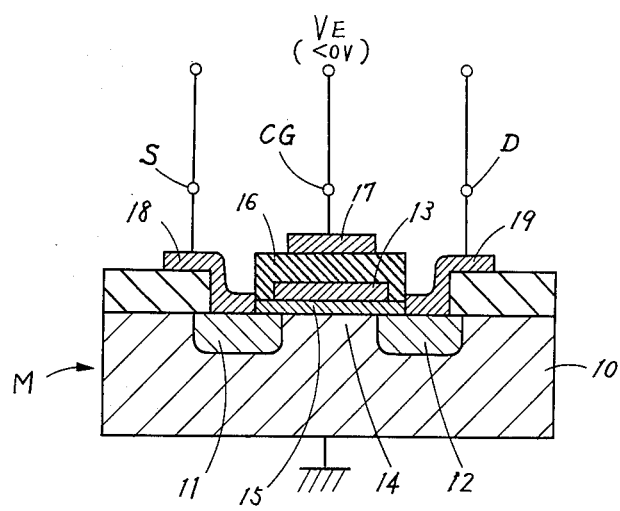
FIG. 11 is a view similar to that shown in FIG. 10 but diagrammatically shows a connection of the memory device in accordance with another embodiment for the purpose of performing an erase operation.

FIG. 11 is a view similar to that shown in FIG. 10 but diagrammatically shows a connection of the memory device M in accordance with another embodiment for the purpose of performing an erase operation. Referring to FIG. 11, the control gate is shown connected to an erase voltage source VE for supplying an erase voltage VE which is a negative voltage in this case, the drain and source regions are shown as opened, and substrate 10 is shown connected to ground. As is readily appreciated, application of the erase voltage VE to the control gate with respect to the substrate connected to ground serves to expel the electric charge stored in the control gate, whereby the stored analog information is erased.

Figure 12:
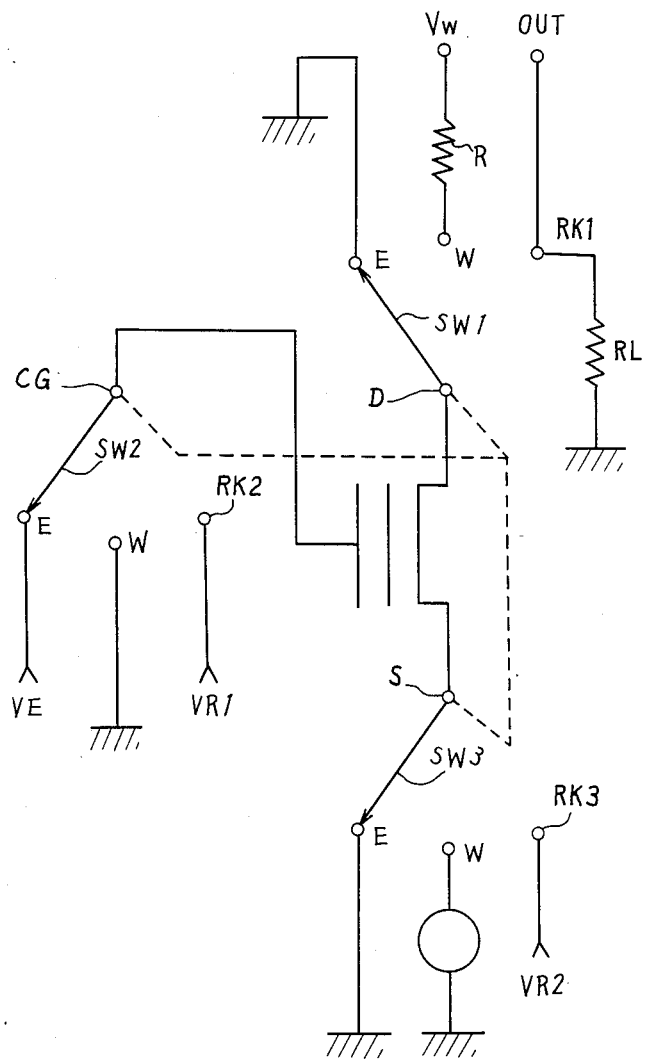
FIG. 12 is a schematic diagram of a memory device connected to perform the three operation modes, i.e. an erase mode, a write mode and a read mode.

FIG. 12 is a schematic diagram of the memory device M connected to perform the three operation modes, i.e. an erase mode, write mode and read mode. It is pointed out that the embodiment shown in FIG. 12 is adapted to employ the erase operating connection shown in FIG. 10 for an erase mode, the write operating connection shown in FIG. 6 (and hence in FIG. 3) for a write mode, and the read operating connection shown in FIG. 8 for a read mode. To accomplish that end, three switches SW1, SW2 and SW3 are coupled in a ganged fashion to the drain D, the control gate CG and the source S, respectively, as a common contact of each switch. A contact E for the erase mode of the switch SW1 is connected to ground, a contact W for the write mode of the switch SW1 is connected through the resistor R to the write voltage source VW whereby the respective resistor R may be referred to as a write resistor, and a contact RKI for the read mode of the switch SW1 is connected through the load resistor RL to ground and is also connected to an output terminal OUT. A contact E for the erase mode of the switch SW2 is connected to the erase voltage source VE, a contact W for the write mode of the switch SW2 is connected to ground, and a contact RK2 for the read mode of the switch SW2 is connected to the first read voltage source VR1. A contact E for the erase mode of the switch SW3 is connected to ground, a contact W for the write mode of the switch SW3 is connected to the analog value voltage VS, and a contact RK3 for the read mode of the switch SW3 is connected to the second read voltage source VR2.

As is readily appreciated, turning of the switches SW1, SW2 and SW3 to the contacts E of the switches achieves the connection of the memory device M as shown in FIG. 10, turning of the switches SW1, SW2 and SW3 to the contacts W of the switches achieves the connection of the memory device M as shown in FIG. 6 and thus as shown in FIG. 3, and turning of the switches SW1, SW2 and SW3 to the contacts RK1, RK2, RK3 of the switches achieves the connection of the memory device M as shown in FIG. 8. Thus, the embodiment shown in FIG. 12 performs the operations of the three operation modes, i.e. an erase mode, write mode and read mode.

Figure 13:
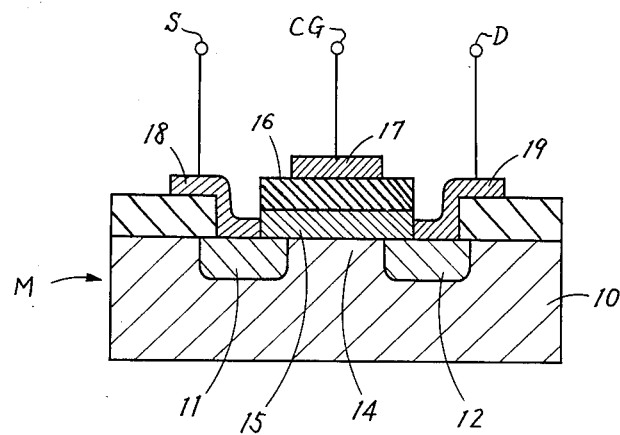
FIG. 13 is a view similar to that shown in FIG. 1 but diagrammatically shows a sectional view of a memory device of a slightly different structure for use in the present invention.

FIG. 13 is a view similar to FIG. 1 but shows diagrammatically a sectional view of a memory device with a slightly different structure for use in the present invention. In comparing the structure shown in FIG. 13 to the structure shown in FIG. 1, the memory device M shown in FIG. 13 fails to comprise the floating gate 13, the first insulating layer 15 is made of silicon dioxide, and the second insulating layer 16 is made of silicon nitride. Since the remaining portions of the memory device M shown in FIG. 13 are the same as those of the memory device shown in FIG. 1, it is not believed necessary to describe the structure of the memory device shown in FIG. 13 in more detail. It is well known that the interface region between the first and second insulating layers 15 and 16 beneath the control gate 17 serves as an electric charge storing layer, when the first and second insulating layers are made of silicon dioxide and silicon nitride, respectively. Hence, the memory device M shown in FIG. 13 functions in substantially the same manner as that of the memory device M shown in FIG. 1 and the memory device M shown in FIG. 13 can be used in substantially the same manner as those described in conjunction with the memory device shown in FIG. 1. It is pointed out that such memory device M as shown in FIG. 13 is often referred to as an MNOS memory.

Figure 14:
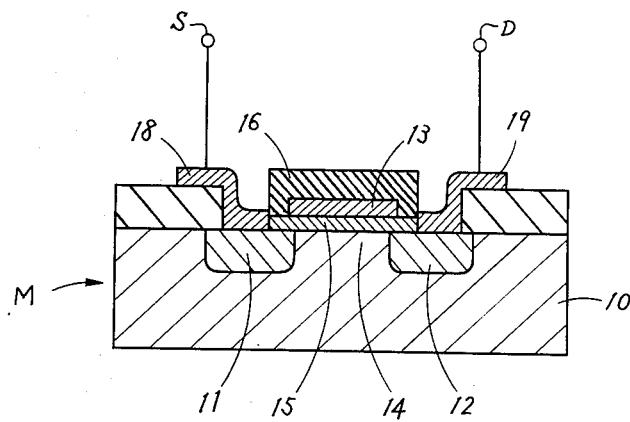
FIG. 14 is also a view similar to those shown in FIGS. 1 and 13 but diagrammatically shows a sectional view of a memory device of a further different structure.

FIG. 14 is also a view similar to FIGS. 1 and 13 but shows diagrammatically a sectional view of a memory device of yet another different structure. More specifically, in comparing the memory device M shown in FIG. 14 to the memory device M shown in FIG. 1, the memory device M shown in FIG. 14 does not comprise a control gate 17, while the remaining portions of the memory device M shown in FIG. 14 are the same as those of the memory device M shown in FIG. 1. Hence, it is not believed necessary to describe the structure of the memory device M shown in FIG. 14 in more detail. The memory device M shown in FIG. 14 can also be used similarly for the purpose of the present invention. However, due to the above described difference in structure, the memory device M shown in FIG. 14 need be used in a slightly different manner for the purpose of the present invention. More specifically, for the purpose of the erase mode, neither the connection shown in FIG. 10 nor the connection shown in FIG. 11 can be used due to the lack of a control gate. Instead, a light erasing mechanism need be employed to cause a light beam to impinge upon the floating gate 13 for the purpose of the erase mode. It is well known that impingement of a light beam upon the floating gate expels the electric charge stored therein, thereby erasing the stored information. For the purpose of the write mode operation, only the connection shown in FIG. 6 can be used whereas the connection shown in FIG. 7 cannot be used due to the lack of a control gate, as is readily appreciated. For the purpose of the read mode operation, either the connection shown in FIG. 8 or the connection shown in FIG. 9 can be used, provided that no read voltage is applied to the control gate because of the lack of a control gate. Subject to the above described restrictions on the connections of the memory device M for the purpose of the erase, write and read mode operations, the memory device of the structure as shown in FIG. 14 can also be used for the purpose of the present invention.

In the foregoing, several embodiments of the inventive analog value storing and reproducing apparatus adapted for storing an analog value in one memory device were described. Furthermore, implementation of a memory array including an array of a plurality of such memory devices makes it possible to store a plurality of analog value voltages. Such a plurality of analog value voltages may comprise sampled analog values obtained by sampling an analog signal at a plurality of sampling time points. Thus, implementation of a memory array, including an array of a plurality of such memory devices, also makes it possible to store and reproduce an analog signal represented in the form of sampled analog value voltages obtained by sampling an analog signal at a plurality of sampling time points. Accordingly, a further preferred embodiment of the present invention comprises an analog signal storing and reproducing apparatus, wherein a series of sampled analog values are obtained by sampling in sequential time order an analog signal at a predetermined cycle, and the respective sampled analog values are in succession in a plurality of memory devices, whereby an analog signal is stored in the form of a series of sampled analog values, whereupon the stored analog values are read out in sequential time order at a predetermined cycle to reproduce an original analog signal.

Figure 15:
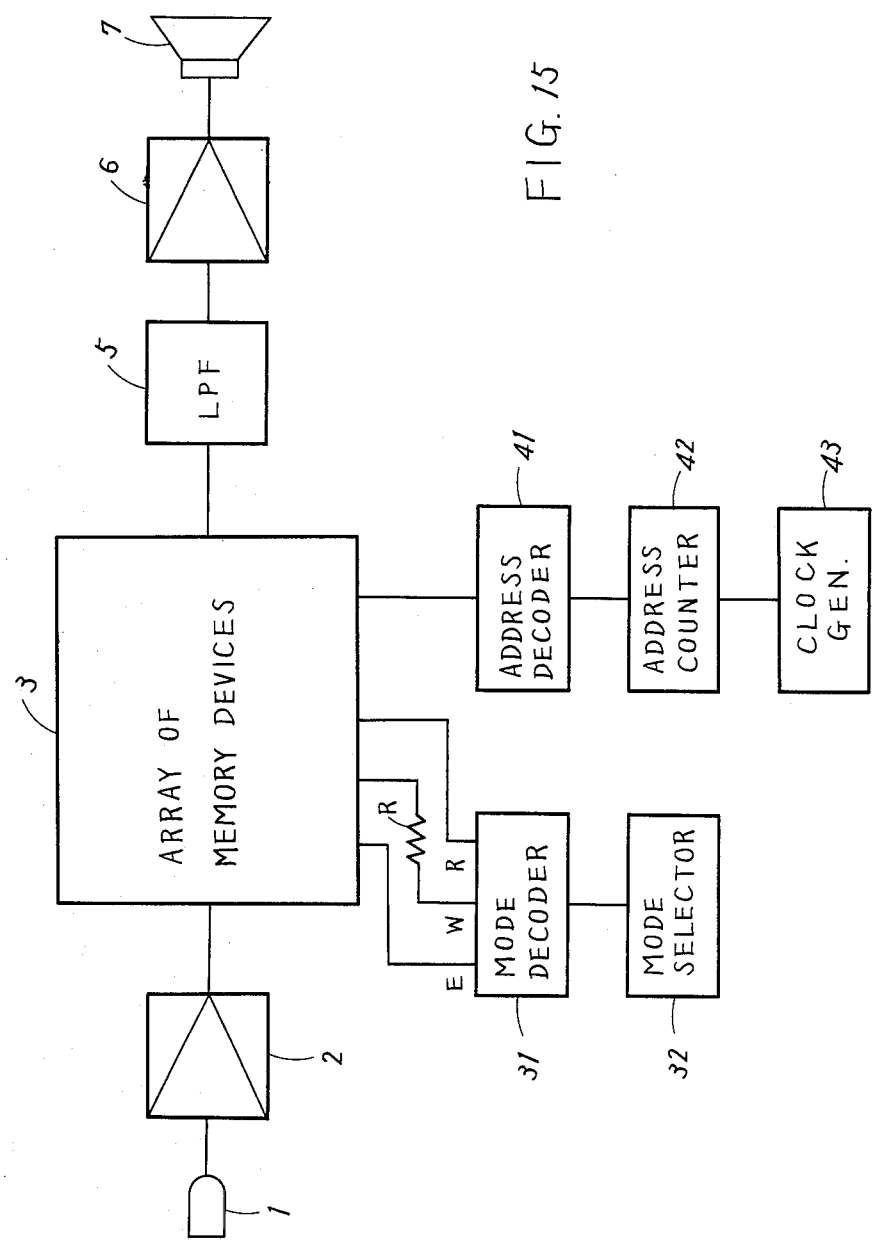
FIG. 15 is a block diagram showing the principle of such analog signal storing and reproducing apparatus.

FIG. 15 is a block diagram showing the principle of such analog signal storing and reproducing apparatus. The embodiment shown in FIG. 15 is adapted to store and reproduce an audio signal by way of a sample of an analog signal. To that end, a sound is applied to a microphone 1, where the sound is transduced to an audio electrical signal which is a kind of analog signal. The audio signal from the microphone 1 is applied to an amplifier 2, where the audio signl is amplified. The amplified audio signal is applied to a memory 3, which comprises an array of memory devices. More specifically, the array 3 comprises a plurality of such memory devices, as previously described, arranged such that the devices can be addressed as a function of an addressing signal. An output from the memory 3 is applied to a low-pass filter 5, so that any high frequency component included in the output is removed. The output from the low-pass filter 5 is applied to an amplifier 6, where the signal is amplified, and the output is then applied to a speaker 7 to produce a sound representing the original sound.

For the purpose of addressing memory devices of the array 3, an addressing circuit is coupled to the array 3. The addressing circuit comprises a clock generator 43 for supplying a clock signal at a predetermined cycle, an address counter 42 for counting the clock pulses, and an address decoder 41 for decoding the count value in the address counter and translating it into an address signal. In a case where the memory devices are arranged in rows and columns in the array 3, the address decoder 41 comprises a row address decoder and a column address decoder. The clock generator 43 and the address counter 42 serve to determine the cycle of the sampling operation and, for the purpose of storing and reproducing an audio signal, the clock generator 43 is adapted to provide a clock signal at the interval of 250 $\mu$sec, for example. For the purpose of determining the operation mode of the memory array 3, a mode selecting apparatus is provided. Typically, the operation modes comprise an erase mode for erasing stored information, a write mode for storing information, and a read mode for reproducing the stored information. The mode selecting apparatus comprises a mode selector 32 and a mode decoder 31 for providing voltages necessary for the respective modes.

In operation, if and when an erase mode is selected, no addressing signal is supplied to the memory array 3 and an erase voltage is applied to the memory array 3. The erase voltage is supplied to all of the memory devices in the array 3, whereby any information stored in any of the memory devices is erased.

In a write mode, the clock generator 43 provides a clock signal, which is supplied to the address counter 42 and is counted. The count value in the address counter 42 is decoded by the address decoder 41. The address decoder 41 comprises a row address decoder and a column address decoder and the address signal is generated by the row address decoder and the column address decoder. When a clock signal is generated by the clock generator 43, the count value in the address counter 42 increases, and the address of the array addressed by the row address decoder and the column address decoder is sequentially changed. The write voltage obtained from the mode decoder 31 is supplied through a resistor R having a relatively high resistance value to only the memory device, as addressed. The analog signal obtained from the amplifier 2 is adapted to be supplied to all of the memory devices in the array 3. As a result, an analog value of the analog signal sampled at the time when the memory device is addressed is stored only in that memory device. The next adjacent memory device is then addressed in response to the next clock signal and an analog value of the analog signal at that timing signal is stored in the next adjacent memory device. Thereafter the analog signal is thus sampled each time the next adjacent memory device is addressed and the analog signal is thus stored in succession in a plurality of memory devices in the form of a series of analog values obtained by sampling the analog signal at the successive addressing timing points.

In a read mode, the read voltage is supplied to all of the memory devices, whereby these are rendered ready for reading. The memory devices are addressed in the same manner as in the write mode and the analog value stored in each of the memory devices is read out when the same is addressed. The analog values thus read out in sequential time order are supplied in succession to the low-pass filter 5, whereby the high frequency component is removed to reproduce the original analog signal. The analog signal thus reproduced is amplified by the amplifier 6 and the amplified output is applied to the speaker 7. As a result, the sound of the reproduced analog signal is produced.

Figure 16:
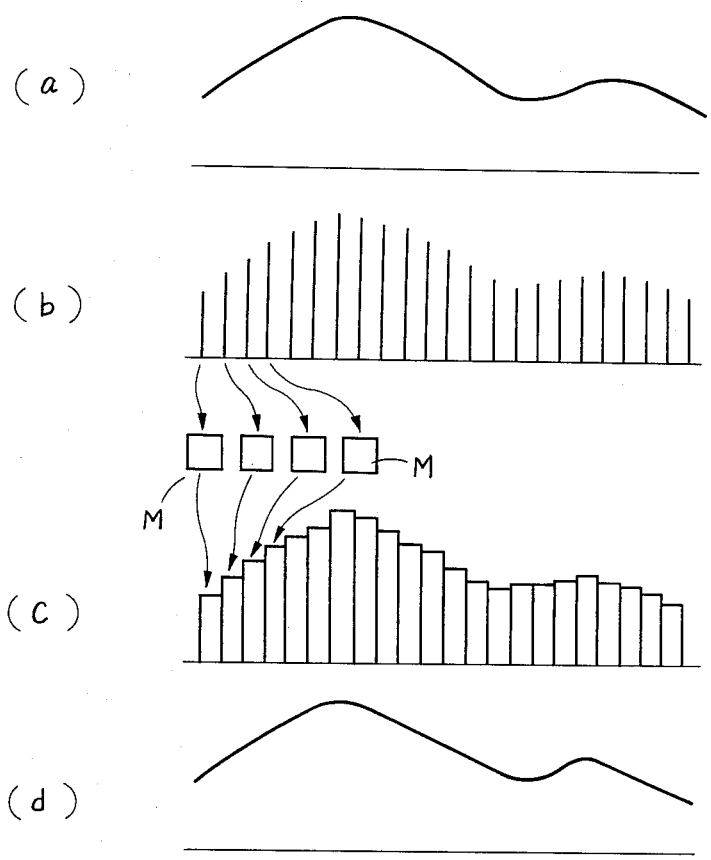
FIG. 16 is a graph showing waveforms of electrical signals at various portions in the diagram shown in FIG. 15.

FIG. 16 is a graph showing waveforms of the electrical signals at various portions in the diagram shown in FIG. 15. More specifically, the waveform (a) is that of the original analog signal obtained from the amplifier 2, the waveform (b) is that of the analog values obtained by sampling the analog signal (a), which are to be stored in the memory devices M, the waveform (c) is that of the analog values read from the memory devices, and the waveform (d) is that of an analog signal after the reproduced output is filtered by the low-pass filter 5.

Figures 17, 17B:
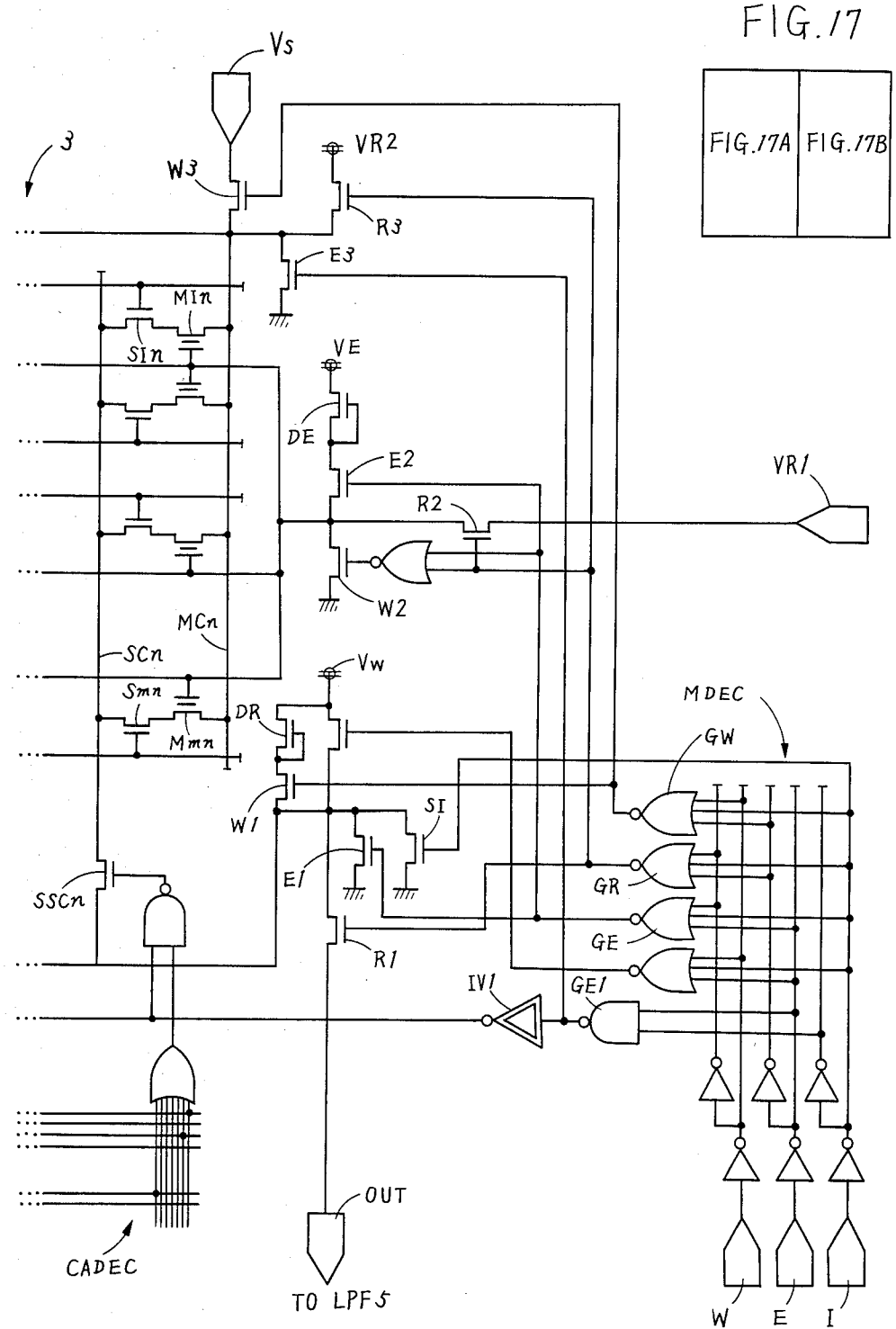
FIG. 17 consisting of FIGS. 17A and 17B is a schematic diagram of the mode decoder, the address decoder and the memory array shown in FIG. 15.
Figure 17A:
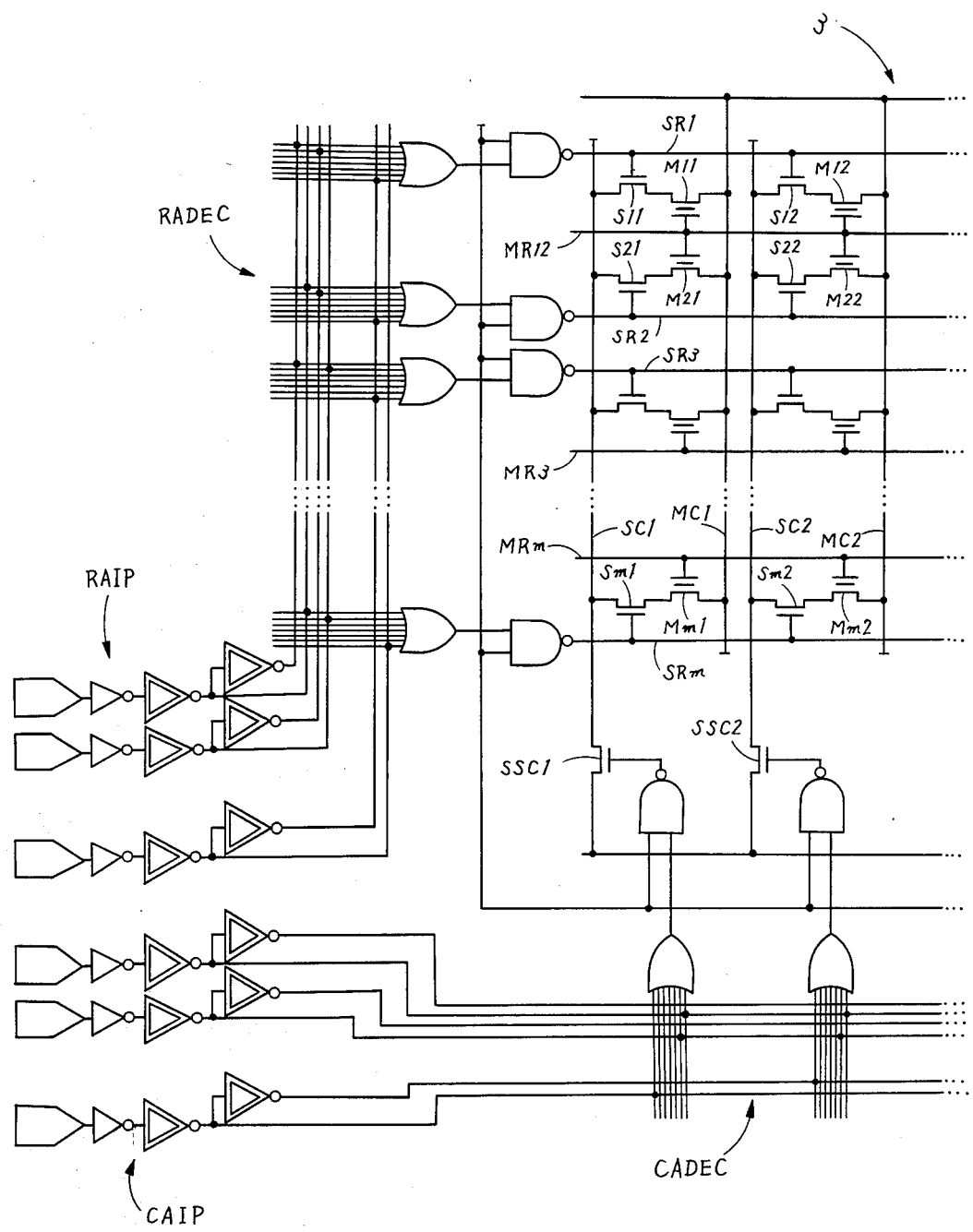

FIG. 17 consisting of FIGS. 17A and 17B is a schematic diagram of one example of the mode decoder 31, the address decoder 41 and the memory array 3. Referring to FIGS. 17A and 17B, the address decoder 41 comprises a row address decoder RADEC including a matrix as seen at the left end of the diagram shown in FIG. 17A and a column address decoder CADEC including a matrix as seen at the bottom of the diagram shown in FIGS. 17A and 17B. The input terminals of the row address decoder RADEC are connected to a row address input RAIP and the input terminals of the column address decoder CADEC are connected to a column address input CAIP. The mode decoder 31 comprises a mode decoder MDEC as seen at the right end of the diagram shown in FIG. 17B. The mode decoder MDEC comprises a matrix connected, as shown, to the input terminals W, E and I and gates GW, GR, GE and GE1 and inverter IV1 are connected to the matrix of the mode decoder MDEC, as shown. The mode decoder MDEC is thus coupled to input terminals W, E and I. In the embodiment shown, a convention is used in which the term "high level" represents a relatively low voltage while the term "low level" represents a relatively high voltage and further that the high level of the terminal W denotes a write mode, the high level of the terminal E denotes an erase mode, and the low level of both the terminals W and E denotes a read mode. The embodiment shown is adapted to further comprise another mode, an interrupt mode I, which is denoted by the low level of the terminal I. The interrupt mode I will be described after the erase, write and read modes are described.

The schematic diagram of the memory array 3 is shown in the center of the diagram shown in FIGS. 17A and 17B. As seen from the figures, the memory array 3 comprises of a plurality of memory devices arranged in rows and columns. The first row comprises memory devices M11, M12, . . . M1n, the second row comprises memory devices M21, M22, . . . M2n, and so on and the m-th row comprises memory devices Mm1, Mm2, . . . Mmn. Corresponding switching devices S11, S12, . . . S1n; S21, S22, . . . S2n; . . . ; Sm1, Sm2, . . . Smn, are each connected to the memory devices M11, M12, . . . M1n; M21, M22, . . . M2n; . . . ; Mm1, Mm2, . . . Mmn, respectively, at the drain side (the left side as viewed) of each of the memory devices, in series. The opposite sides (the left side as viewed) of the switch devices S11, S21, . . . Sm1 are commonly connected to a switching device column line SC1; the opposite sides (the left side as viewed) of the switch devices S12, S22, . . . Sm2 are commonly connected to a switching device column line SC2; and so on, and the opposite sides (the left side as viewed) of the switch devices S1n, S2n, . . . Smn are commonly connected to a switching device column line SCn.

The source sides (the right side as viewed) of the memory devices M11, M21, . . . Mm are commonly connected to a memory device column line MC1; the source sides (the right side as viewed) of the memory devices M12, M22, . . . Mm2; . . . Mm2 are commonly connected to a memory device common line MC2; and so on; and the source sides (the right side as viewed) of the memory devices M1n, M2n, . . . Mmn, are commonly connected to a memory device column line MCn.

The control gates of the switch devices S11, S12, . . . S1n are commonly connected to a switch device row line SR1; the control gates of the switch devices S21, S22, . . . S2n are commonly connected to a switch device row line SR2; and so on; and the control gates of the switch devices Sm1, Sm2, . . . Smn are commonly connected to a switch device row line SRm.

The control gates of the memory devices M11, M12, . . . M1n are commonly connected to a memory device row line MR1; the control gates of the memory devices M21, M22, . . . M2n are commonly connected to a memory device row line MR2 (in the embodiment shown the memory device row lines MR1 and MR2 are shown by a single line denoted as MR12 for simplicity of illustration); and so on; and the control gates of the memory devices Mm1, Mm2, . . . Mmn are commonly connected to a memory device row line MRm.

The switch device row lines SR1, SR2, . . . SRn are connected to the respective outputs of the row address decoder RADEC. All of the switch device column lines SC1, SC2, . . . SCn are connected through switch devices SSC1, SSC2, . . . SSCn, respectively, and are thereafter commonly connected. The control gates of the switch devices SSC1, SSC2, . . . SSCn are connected to the respective outputs, respectively, of the column address decoder CADEC. It is pointed out that each of the memory devices is addressed as an intersection of one of the switch device row lines SR1, SR2, . . . SRn and one of the switch device column lines SC1, SC2, . . . SCn.

The common connection of the switch device column lines SC1, SC2, . . . SCn is connected through a switch device E1 to ground, through a switch device W1 and further through a device DR to a write voltage source VW, through a switch device R1 to an output terminal OUT, and through a switch device SI to ground. The control gate of the switch device E1 is connected to the output of the gate GE. The control gate of the switch device W1 is connected to the output of the gate GW. Since the device DR is of the depletion type, the control gate of the device DR is connected to the drain of the device DR, so that a resistance element may be formed in a well-known manner. It is pointed out that the resistance implemented by the device DR provides the resistance value of the write resistor R shown in FIG. 12. The control gate of the switch device R1 is connected to the output of the gate GR.

All of the memory device row lines MR1, MR2, . . . MRm are commonly connected and the common connection is connected through a switch device E2 and another device DE of the depletion type (connected to form a resistance element) to the erase voltage source VE, through a switch device W2 to ground, and through a switch device R2 to the read voltage source VR1. The control gate of the switch device E2 is connected to the output of the gate GE, the control gate of the switch device W2 is connected to a NOR gate the inputs of which are connected to the outputs of the gates GR and GE, and the control gate of the switch device R2 is connected to the output of the gate GR.

All of the memory device column lines MC1, MC2, . . . MCn are commonly connected and the common connection is connected through a switch device E3 to ground, through a switch device W3 to the analog signal source VS, and through a switch device R3 to the read voltage source VR2. The control gate of the switch device E3 is connected to the output of the gate GE1, the control gate of the switch device W3 is connected to the output of the gate GW, and the control gate of the switch device R3 is connected to the output of the gate GR.

The operation of the analog signal storing and reproducing apparatus shown in FIG. 17 will now be described in the following.

In the erase mode, the erase terminal E and the inhibit terminal I are brought to a high level, while the write terminal W is maintained at the low level. Such logical states of the inputs to a mode decoder MDEC are decoded by the mode decoder MDEC of provide the outputs from the gates GE and GE1. The switch device E3 is turned on in response to an output from the gate GE1 and the switch devices E2 and E1 are turned on in response to an output from the gate GE. As a result, the common connection to the memory device column lines MC1, MC2, . . . MCn is connected to ground, the common connection to the memory device row lines MR1, MR2, . . . MRm is connected to the erase voltage source VE, and the common connection to the switch device column lines SC1, SC2, . . . SCn is connected through the switch device E1 to ground. At that time the output from the inverter IV1 is at the low level and as a result the high level output is obtained from the NAND gates connected to the outputs of the low address decoder RADEC and the column address decoder CADEC. Therefore, all the switch devices S11, S12, . . . S1n; S21, S22, . . . S2n; . . . ; Sm1, Sm2, . . . Smn, are turned on and the switch devices SSC1, SSC2, . . . SSCn are also all turned on. As a result, the drain sides (the left side as viewed) of all of the memory devices are connected through the switch device column lines SC1, SC2, . . . SCn and the common connection thereto and further through the switch device E1 to the ground. The source sides (the right side as viewed) of all of the memory devices are also connected through the memory device column lines MC1, MC2, . . . MCn and the common connection thereto and further through the switch device E3 to the ground. The control gates of all of the memory devices are connected through the memory device row lines MR1, MR2, . . . MRm and the common connection thereto and further through the switch device E2 to the erase voltage source VE. Thus it should be appreciated that all of memory devices are connected in the same erase mode connection as described in conjunction with FIG. 12. As a result, any information stored in all of the memory devices is erased.

In the write mode, the write terminal W and the inhibit terminal I are brought to the high level, while the erase terminal E is maintained at the low level. Such logical states of the terminals are decoded by the mode decoder MDEC and as a result the outputs are obtained only from the gate GW and the inverter IV1. Then the switch devices W3 and W1 are turned on. The low level outputs from the gates GR and GE are also NORed by the NOR gate and the output from the NOR gate is applied to the switch device W2, whereby the switch device W2 is also turned on. As a result, the common connection to the switch device column lines SC1, SC2, . . . SCn is connected through the switch device DR to the write voltage source VW, the common connection to the memory device row lines MR1, MR2, . . . MRn is connected through the switch device W2 to the ground and the common connection to the memory device column lines MC1, MC2, . . . MCn is connected through the switch device W3 to the analog signal source VS. As a result, the source sides (the right side as viewed) of all of the memory devices are connected to the analog signal source VS and the control gates of all of the memory devices are connected to the ground. On the other hand, assuming that the output is obtained only from the lowermost NAND gate of the row address decoder RADEC and the output is obtained from the leftmost NAND gate of the column address decoder CADEC as a result of addressing at that time, then only the switch device row line SRm and the switch device column line SC1 are brought to the high level. As a result, only the switch device Sm1 out of the switch devices S11, S12, . . . S1n; S21, S22, . . . S2n; . . . ; Sm1, Sm2, . . . Smn, is enabled to perform a write operation. As a result, the drain side, the left side as viewed, of only memory device Mm1 is connected through the switch device Sm1 and the switch device W1 and further through the switch device DR to the write voltage source VW. Therefore, the following occur only for memory device Mm1: the source thereof is connected to the analog signal source VS, the control gate is connected to the ground, and the drain is connected through the device DR serving as a resistor having a relatively high resistance value to the write voltage VW. Therefore, only the memory device Mm1 among all of the memory device M11, M12, . . . M1n; M21, M22, . . . M2n; . . . ; Mm1, Mm2, . . . Mmn, is placed in the same write mode connection as described in conjunction with FIG. 12. As a result, the analog value of the analog signal at that time, i.e. at the time the memory device Mm1 is addressed, is stored in the memory device Mm1. Referring to FIG. 15, if and when the clock signals are generated in succession by the clock generator 43, the count value in the address counter 42 is incremented and as a result the outputs from the row address decoder RADEC and the column address decoder CADEC are accordingly incremented. As a result, the memory devices are successively addressed and the analog values obtained or sampled from the analog signal at the time each memory device is addressed and stored in sequential time order in the respective memory devices. Thus, the analog signal is stored in the memory array 3 in the form of a series of analog values sampled at the time each memory device is addressed.

In the read mode, the write terminal W and the erase terminal E are both brought to a low level, while only the inhibit terminal I is brought to a high level. It is recalled that previously the convention was followed in which the low level of both the write terminal W and the erase terminal E denotes the read mode. Such logical states of the input terminals W, E and I are decoded by the mode decoder MDEC and as a result the outputs are only obtained from the gate GR and the inverter IV1. Accordingly, the switch devices R1, R2 and R3 are turned on. Therefore, the common connection to the memory device column lines MC1, MC2, . . . MCn is connected through the switch device R3 to the read voltage source VR2, the common connection to the memory device row lines MR1, MR2, . . . MRn is connected through the switch device R2 to the read voltage source VR1, and the common connection to the switch device column lines SC1, SC2, ... SCn is connected through the switch device R1 to the output terminal OUT. Now assuming that the lowermost NAND gate of the row address decoder RADEC provides the high level and the leftmost NAND gate of the column address decoder CADEC provides the high level as a result of addressing, then the switch device row line SRm and the switch device column line SC1 are brought to the high level and as a result only the switch device Sm1 out of the switch devices S11, S12, ... S1n; S21, S22, ... S2n; ...; Sm1, Sm2, ... Smn is enabled to perform a read operation. In such a situation, the source sides (the right side as viewed) of all of the memory devices are connected through the memory device column lines MC1, MC2, ... MCn and through the common connection thereto and further through the switch device R3 to the read voltage source VR2, the control gates of all the memory devices are connected through the memory device row lines MR1, MR2, ... MRm and the common connection thereto and further through the switch device R2 to the read voltage source VR1, and the drain side (the left side as viewed) of only memory device Mm1 is connected through the switch device Sm1 and through the switch device column line SC1 and the switch device SSC1 and further through the switch device R1 to the output terminal OUT. As a result, only memory device Mm1, out of all the memory devices, is placed in the same read mode connection as described in conjunction with FIG. 12, apart from the load resistance RL being omitted for simplicity of illustration, and the analog value stored in the memory device Mm1 is read out at the time the memory device Mm1 is addressed.

Referring to FIG. 15, the clock signals are generated in succession by the clock generator 43 and the count value in the address counter 42 is incremented in succession. As a result, the outputs from the row address decoder RADEC and the column address decoder CADEC are also incremented in time sequence and as a result the memory devices are addressed in time sequence. As a result, the analog values stored in all of the memory devices are read out in time sequence to provide the waveform shown as the waveform (c) in FIG. 16. The output of the waveform (c) shown in FIG. 16 obtained from the output terminal OUT is supplied to the low-pass filter 5, where the high frequency component is removed to provide the signal of the waveform (d) shown in FIG. 16, which closely resembles the original analog signal.

The inhibit mode, briefly described above, will now be described in more detail. In order to increase the capacity of the memory, two or more arrays of the memory devices may be used. If and when a plurality of memory arrays 3 are employed in the inventive analog signal storing and reproducing apparatus, it is preferred that while one memory array is in operation, the remaining memory arrays are disabled in order to prevent any possibility of interference. To that end, the inhibit terminal I is provided and is connected to the mode decoder MDEC as shown.

In the inhibit mode, all of the input terminals W, E and I are brought to a low level. As a result, the inverted output of the low level input to the terminal I is applied to the switch device SI, whereby the common connection to the switch device column lines SC1, SC2, ... SCn is connected to ground through the switch device SI. The output of the gate GE1 is also obtained and is applied to the switch device E3 to turn on the same, whereby the common connection to the memory device column device MC1, MC2, ... MCn is connected to ground through the switch device E3. The low level output from the gates GR and GE are also NORed by the NOR gate and the NORed output is applied to the gate W2, whereby the common connection to the memory device row lines MR1, MR2, ... MRm is connected to ground through the switch device W2. Since all of the common lines of the memory devices are thus connected to ground, the memory array 3 receiving the low level inputs at the input terminals W, E and I is disabled.

Selection of the resistance value of the device DR providing the resistor R having a relatively high resistance value will now be considered. For the same reason as previously described in conjunction with the analog value storing and reproducing apparatus, the relatively high resistance value of the resistor implemented by the device DR is selected to be, at least, high enough to sufficiently decrease the rate of charging per unit time of the electric charge storing layer due to a voltage drop of the write voltage determined as a voltage drop division of the relatively high resistance value of the resistor and the resistance value of each of the memory devices at the time when a channel is formed in the channel region of each memory device. Nevertheless, in the case of the analog signal storing and reproducing apparatus, there is an upper limit to the relatively high resistance value of the resistor in light of the sampling time. More specifically, in the case of the analog signal storing and reproducing apparatus, the relatively high resistance value of the resistor is preferably selected to be, at most, small enough to decrease the transfer delay of the write voltage caused as a function of the product of the resistance value and a parasitic capacitance value with respect to the sampling time of the analog signal determined by the addressing.

It is pointed out that any modifications to the erase mode connection, the write mode connection and the read mode connection, and any modifications to the memory devices, previously described in conjunction with the analog value storing and reproducing apparatus, are equally applicable to the analog signal storing and reproducing apparatus. Since such modifications in the analog signal storing and reproducing apparatus are self-explanatory in consideration of the description of such modifications in conjunction with the analog value storing and reproducing apparatus, it is not believed necessary to describe such modifications in detail in conjunction with the analog signal storing and reproducing apparatus.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analog signal storing apparatus, comprising: a memory array including an array of a plurality of semiconductor field-effect devices arranged in rows and columns, each field-effect device including a semiconductor substrate of one conductivity type, first and second regions of the opposite conductivity type formed on said semiconductor substrate spaced apart from each other for defining a channel region therebetween, a first insulating layer formed on said channel region, an electric charge storing layer formed on said first insulating layer above said channel region, a second insulating film formed on said electric charge storing layer, and a control gate formed on said second insulating layer above said electric charge storing layer, said semiconductor field-effect device exhibiting a first resistance value between said first and second regions across said channel region as a function of the quantity of an electric charge stored in said electric charge storing layer, addressing means coupled to said memory array for sequentially addressing said plurality of semiconductor field-effect devices, a single write voltage supply commonly coupled to one of said first and second regions of all of said plurality of semiconductor field-effect devices forming said rows and columns and responsive to said sequential addressing by said addressing means for supplying a write voltage to said semiconductor field-effect devices for sequentially charging said electric charge storing layer of said semiconductor field-effect devices in accordance with said sequential addressing, a single write resistor (DR) connected with one resistor end to said write voltage supply and with the other resistor end connected to said one of said first and second regions of all of said plurality of semiconductor field-effect devices so that said single write voltage supply supplies said write voltage to all field-effect devices in all rows and in all columns, said single write resistor (DR) having a relatively high second resistance value selected to be, at least, high enough to sufficiently decrease the rate of changing per unit of time of said electric charge storing layer due to a voltage drop of said write voltage determined by the ratio of said relative high second resistance value of said single resistor and said first resistance value of each of said semiconductor field-effect devices at the time when a channel is formed on said channel region of each of said semiconductor field-effect devices, said second resistance value of said single resistor being further selected to be, at most, small enough to decrease the transfer delay of said write voltage caused as a function of the product of said second resistance value and a parasitic capacitance value with respect to the sampling time of an analog signal determined by said sequential addressing, and analog signal supply means commonly coupled to one of said control gates and the other of said first and second regions of each of said plurality of semiconductor field-effect devices for commonly supplying an analog signal to said plurality of semiconductor field-effect devices, whereby said electric charge storing layer of each said semiconductor field-effect devices, as sequentially addressed, starts being charged as a function of said write voltage and the analog value voltage of said analog signal at the time of addressing, and stops being charged as a function of the voltage of said one of said first and second regions of each said semiconductor field-effect devices, as sequentially addressed, determined as a voltage division of said write voltage and said analog value voltage of said analog signal at the time of addressing by means of said relatively high second resistance value of said resistor means and said first resistance value of each said semiconductor field-effect devices, as sequentially addressed, whereby the quantity of electric charge stored in said electric charge storing layer of each said semiconductor field-effect devices, as sequentially addressed, is determined as a function of said analog value voltage and of said analog signal at the time of addressing, and whereby analog value voltages of said analog signal at a plurality of time points of addressing are stored in said plurality of semiconductor field-effect devices.

2. The analog signal storing apparatus in accordance with claim 1, wherein
said analog signal supply means is coupled to the other of first and second regions of each of said plurality of semiconductor field-effect devices.

3. The analog signal storing apparatus in accordance with claim 1, wherein
said analog signal supply means is coupled to said control gate of each of said plurality of semiconductor field-effect devices, and which further comprises
fixed voltage supply means commonly coupled to the other of said first and second regions of each of said plurality of semiconductor field-effect devices for supplying a fixed voltage thereto.

4. The analog signal storing apparatus in accordance with claim 1, further comprising mode selecting means for selecting operation modes, said operation modes including an erase mode, a write mode and a read mode, erase voltage supply means responsive to a selection of said erase mode for supplying an erase voltage to said control gate of each said semiconductor field-effect devices, connection means responsive to a selection of said write mode for connecting said write voltage supply and said analog signal supply means to each of said semiconductor field-effect devices, and electric charge quantity determining means responsive to a selection of said read mode for determining a quantity of electric charge stored in each said electric charge storing layers.

5. The analog signal storing apparatus in accordance with claim 1, wherein
said analog signal comprises a voice signal.

6. An analog signal storing apparatus comprising: a memory array including an array of a plurality of semiconductor field-effect devices arranged in rows and columns, each field-effect device including a semiconductor substrate of one conductivity type, first and second regions of the opposite conductivity type formed on said semiconductor substrate spaced apart from each other, thereby to define a channel region therebetween, a first insulating layer formed on said channel region, an electric charge storing layer formed on said first insulating layer above said channel region, and a second insulating film formed on said electric charge storing layer, said semiconductor field-effect device exhibiting a first resistance value between said first and second regions across said channel region as a function of the quantity of an electric charge stored in said electric charge storing layer, addressing means coupled to said memory array for sequentially addressing said plurality of semiconductor field-effect devices, a single write voltage supply commonly coupled to one of said first and second regions of all of said plurality of semiconductor field-effect devices and responsive to said sequential addressing by said addressing means for supplying a write voltage to said semiconductor field-effect devices for sequentially charging said electric charge storing layer of the respective semiconductor field-effect device in accordance with said sequential addressing, a single write resistor (DR) connected with one resistor end to said write voltage supply and with the other resistor end connected to said one of said first and second regions of all of said plurality of semiconductor field-effect devices so that said single write voltage supply supplies said write voltage to all field-effect devices in all rows and in all columns, said single write resistor (DR) having a relatively high second resistance value selected to be, at least, high enough to sufficiently decrease the rate of charging per unit time of said electric charge storing layer due to a voltage drop of said write voltage determined by the ratio of said relative high second resistance value of said single resistor and said first resistance value of each said semiconductor field-effect devices at the time when a channel is formed on said channel region of each said semiconductor field-effect devices, said second resistance value being further selected to be, at most, small enough to decrease the transfer delay of said write voltage caused as a function of the product of said second resistance value and a parasitic capacitance value with respect to the sampling time of an analog signal determined by said sequential addressing, and analog signal supply means commonly coupled to the other of said first and second regions of each of said plurality of semiconductor field-effect devices for commonly supplying an analog signal to said plurality of semiconductor field-effect devices, whereby said electric charge storing layer of each said semiconductor field-effect devices, as sequentially addressed, starts being charged as a function of said write voltage and the analog value voltage of said analog signal at the time of addressing and stops being charged as a function of the voltage at said one of said first and second regions of each said semiconductor field-effect devices, as sequentially addressed, determined as a voltage division of said write voltage and said analog value voltage of said analog signal at the time of addressing by means of said relatively high second resistance value of said single resistor and said first resistance value of each said semiconductor field-effect devices, as sequentially addressed, whereby the quantity of electric charge stored in said electric charge storing layer of each said semiconductor field-effect devices, as sequentially addressed, is determined as a function of said analog value voltage of said analog signal at the time of addressing, and whereby said analog value voltages of said analog signal at a plurality of time points of addressing are stored in said plurality of semiconductor field-effect devices.

7. The analog signal storing apparatus in accordance with claim 6, wherein
said analog signal comprises a voice signal.

* * * * *

UNITED STATES PATENT AND TRADEMARK OFFICE
CERTIFICATE OF CORRECTION

PATENT NO. :  4,627,027
DATED      :  December 2, 1986
INVENTOR(S) : Yasuki Rai, Yuji Kitamura, Minoru Hamada It is certified that error appears in the above-identified patent and that said Letters Patent is hereby corrected as shown below:

In the abstract, line 23, replace "and" by --an--;
In claim 1, column 19, line 30, replace "changing" by --charging--;
          column 19, line 54, replace "of" (2nd occurrence) by --at--.

Signed and Sealed this

Twenty-fourth Day of February, 1987

*Attest:*

DONALD J. QUIGG

*Attesting Officer*   *Commissioner of Patents and Trademarks*